(12) United States Patent
Zhong et al.

(10) Patent No.: US 8,933,542 B2
(45) Date of Patent: Jan. 13, 2015

(54) METHOD TO REDUCE MAGNETIC FILM STRESS FOR BETTER YIELD

(71) Applicant: Headway Technologies, Inc., Milpitas, CA (US)

(72) Inventors: Tom Zhong, Saratoga, CA (US); Kenlin Huang, San Jose, CA (US); Chyu-Jiuh Torng, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/454,324

(22) Filed: Aug. 7, 2014

(65) Prior Publication Data

US 2014/0349414 A1 Nov. 27, 2014

Related U.S. Application Data

(62) Division of application No. 13/469,258, filed on May 11, 2012, now Pat. No. 8,803,293.

(51) Int. Cl.
 *H01L 29/06* (2006.01)
 *H01L 29/88* (2006.01)
 *H01L 43/12* (2006.01)
(52) U.S. Cl.
 CPC ...................................... *H01L 43/12* (2013.01)

USPC .................................. 257/623; 257/E27.006
(58) Field of Classification Search
 USPC .................................. 257/295, 421, E27.006
 See application file for complete search history.

(56) References Cited

U.S. PATENT DOCUMENTS

| | | | |
|---|---|---|---|
| 6,391,658 B1 * | 5/2002 | Gates et al. | 438/3 |
| 6,696,744 B2 | 2/2004 | Feygenson et al. | |
| 6,989,575 B2 * | 1/2006 | Gates et al. | 257/421 |
| 2002/0081753 A1 * | 6/2002 | Gates et al. | 438/3 |
| 2005/0090111 A1 * | 4/2005 | Lee | 438/700 |
| 2005/0102720 A1 * | 5/2005 | Lee | 977/DIG. 001 |
| 2010/0226042 A1 | 9/2010 | Nishimori et al. | |

* cited by examiner

*Primary Examiner* — Earl Taylor
(74) *Attorney, Agent, or Firm* — Saile Ackerman LLC; Stephen B. Ackerman

(57) ABSTRACT

A thin-film deposition, such as an MTJ (magnetic tunneling junction) layer, on a wafer-scale CMOS substrate, is segmented by walls or trenches and not affected by thin-film stresses due to wafer warpage or other subsequent annealing processes. An interface layer on the CMOS substrate is patterned by either undercut trenches extending into its upper surface or by T-shaped walls that extend along its upper surface. The thin-film is deposited continuously over the patterned surface, whereupon either the trenches or walls segment the deposition and serve as stress-relief mechanisms to eliminate adverse effects of processing as stresses such as those caused by wafer warpage.

6 Claims, 9 Drawing Sheets

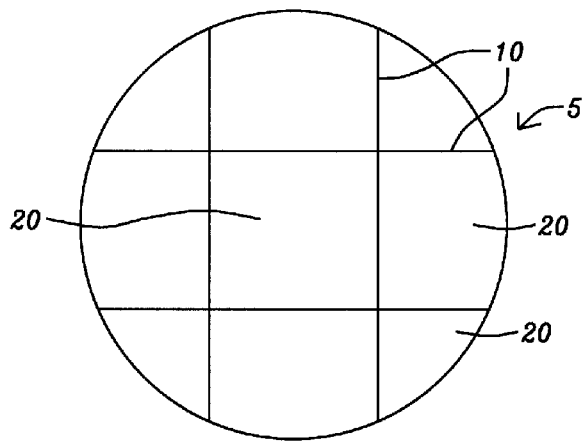
FIG. 1
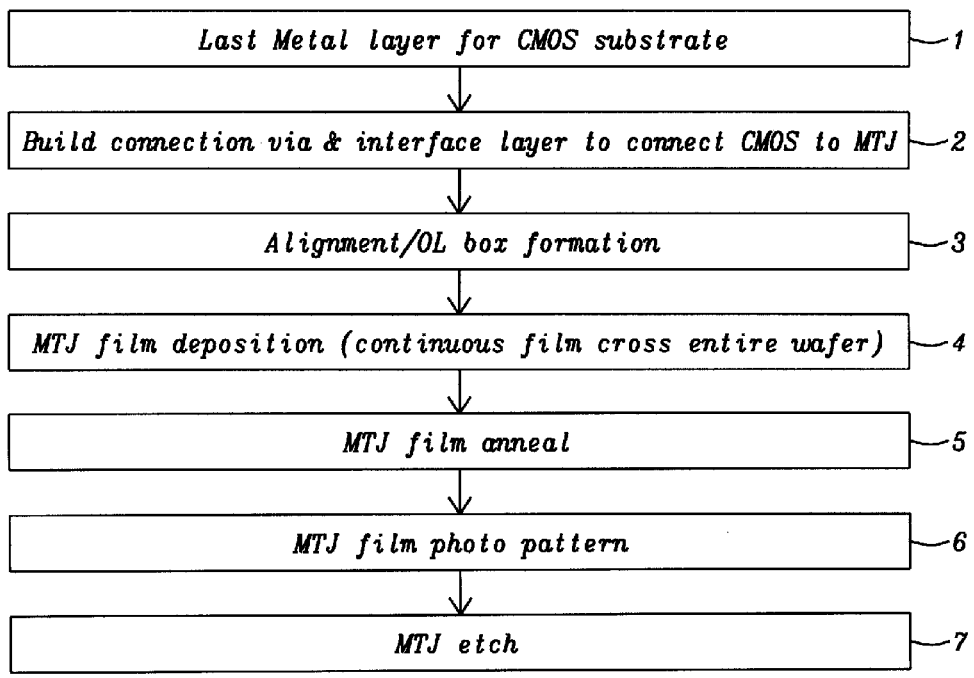
FIG. 2 - Prior Art

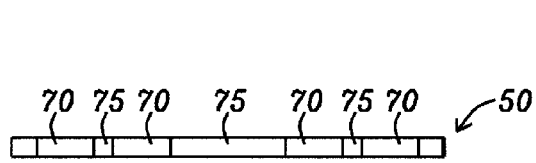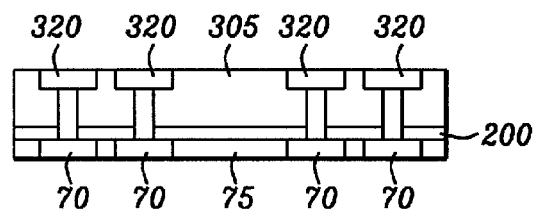
FIG. 9a     FIG. 9b
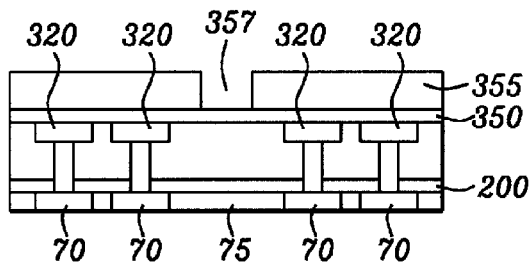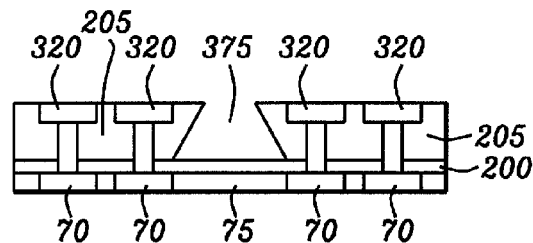
FIG. 9c     FIG. 9d
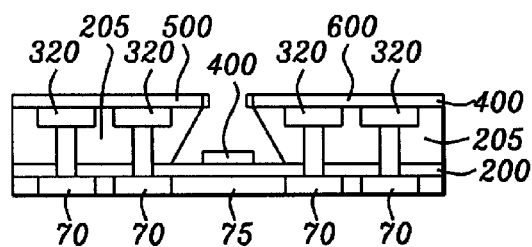
FIG. 9e

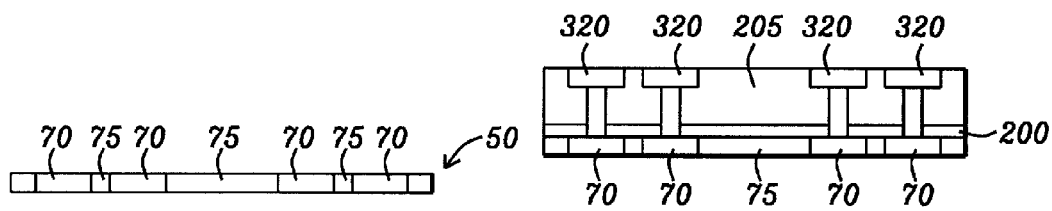
FIG. 11a    FIG. 11b
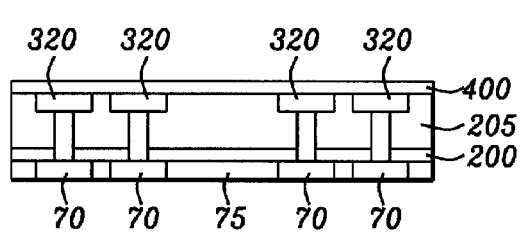 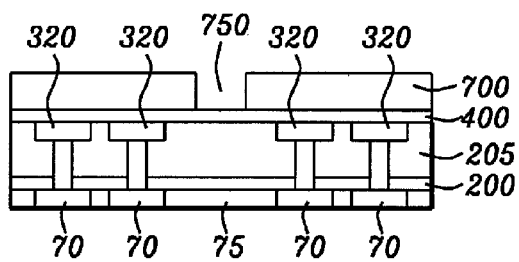
FIG. 11c    FIG. 11d
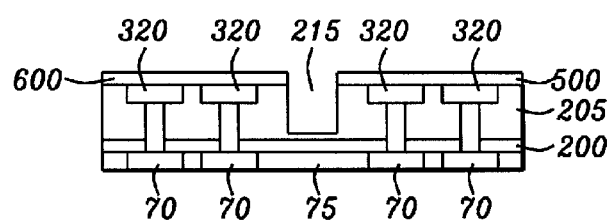
FIG. 11e

METHOD TO REDUCE MAGNETIC FILM STRESS FOR BETTER YIELD

This is a Divisional Application of U.S. patent application Ser. No. 13/469,258 filed on May 11, 2012, which is herein incorporated by reference in its entirety and assigned to a common assignee.

BACKGROUND

1. Technical Field

This disclosure relates generally to magnetic devices that utilize thin film fabrications on wafers, and more specifically, to methods for reducing defects in such fabrications that result from stresses in the films and warpage of the wafers during processing.

2. Description of the Related Art

Spin torque memory based, for example, on MTJ devices, is believed to be scalable down to characteristic technology dimensions on the order of 65 nm and even below. As the technology scales down, the budget for overlay design margins (i.e., room for error) will shrink correspondingly. Magnetic film depositions and annealing processes, for example those used in fabricating MTJ devices) normally introduce significant wafer warpage due to stresses in the films. Currently, most MRAM technology development is done on 200 mm wafers or smaller. When the technology is scaled down to 65 nm, the wafer warpage problem will be magnified because only the 300 mm wafer platform will be available. A further drawback of high stresses in the film depositions is the associated production of defects, such as film delaminations, which are already frequently encountered. The severity of such defects increases with the increases in annealing temperatures. There has been a recognition of the stress problem, as evidenced by U.S. Pat. No. 6,696,744 (Feygenson et al) and U.S. Patent Application 2010/0226042 (Nishimori et al). However, neither of these teachings provides a methodology for dealing with the problem in the manner of the present disclosure.

The following brief and schematic description of a current process to form and process thin-film layered structures will indicate the difficulties encountered. It is these difficulties that will be addressed using the methods of the present disclosure.

Exemplary Current Process

Schematic FIG. 6a, illustrates a first step in an exemplary current process. Its corresponding first process step is described briefly in the first box (1) of the process flow chart of FIG. 2. FIG. 6a (and box (1) of FIG. 2) shows, schematically, in cross-section, a "last metal layer" (50) of a CMOS substrate (full substrate not shown) that will have an MTJ multi-layered deposition (not yet shown) formed over its upper surface and thereby be connected to the CMOS devices and associated circuitry within the substrate. It is to be noted that in this and in all the following descriptions we use the phrase "last metal layer" to refer to an uppermost layer of a CMOS substrate. This last layer contains the metal, electrically conductive connections that will be made to multi-layer thin-film depositions that will be deposited on this last layer of the substrate. When we refer more generally to a CMOS substrate, we mean a substrate that contains within its body CMOS circuitry that would be used to activate the thin-film, multi-layered MTJ devices (formed on its "last metal layer") such as those in an MRAM array. However, it should also be pointed out that the general approach described herein to forming a thin-film multi-layered deposition that will not be subject to defects resulting from process-induced stresses could apply equally well to other wafer-sized substrates that incur warpage when subjected to thermal processes and to other thin film depositions of sufficient size to experience stresses and stress-related defects when formed on such substrates.

The CMOS last metal layer (50) is the uppermost layer of the CMOS substrate (not shown) and it will be assumed to be the starting layer for subsequent process steps in all the methods described herein. It is also assumed, for simplicity, that the CMOS last metal layer includes a segmented, electrically conductive (e.g. metal) connection layer (70) within its upper surface, surrounded by structurally supportive and insulating dielectric material (75), and that the connection layer (70) will ultimately contact appropriate portions of the about-to-be-fabricated MTJ deposition through an interconnecting layer called (in block (2) of FIG. 2) a "connection via & interface layer". It is further assumed that these same conducting connection layers (70) lead to CMOS circuit elements in the CMOS substrate that is beneath the last metal layer. These connections will not be shown herein, however, and the last metal layer will serve to represent all CMOS circuitry in the substrate.

Referring next to the illustration of FIG. 6b and to the description in the second process step of block (2) in FIG. 2, there is illustrated and described a second current process step in the fabrication of an MTJ layer, which is to build a connection via and interface layer which will serve to connect the subsequent MTJ fabrication to the last metal layer ((50) of FIG. 6a) and, thereupon, to the CMOS circuitry. A conducting via (80) is shown above each connecting layer segment (70), each via passing through a first dielectric layer (90), which is an etch-stop layer, and a second dielectric layer (95), which is an interface layer, and terminating at a junction connection (105) that will ultimately contact appropriate portions of an MTJ thin-film deposition. The structure now completed on the last metal layer, including elements (90), (80), (95) and (105) is the "connection via & interface layer" described in bock (2) of FIG. 2. A detailed description of the mode of fabrication of this layer will not be described herein, but new forms of this layer will be described in detail below.

Referring now to FIG. 6c and to the remaining process sequence in FIG. 2, process boxes (3) and (4), describe, sequentially, the formation of an alignment layer (the zero-layer) and a continuous MTJ film deposition on the fabrication of FIG. 6b. In FIG. 6c, the alignment layer and the MTJ film are indicated as a single layer (120), which would typically be formed as two separate but contiguous layers.

Referring finally to FIG. 2, process steps of blocks (5)-(7), there is described a series of exemplary processes performed on the alignment layer and MTJ film (120), including, for example, an anneal, a photo-patterning (e.g. deposition of a photo-resist layer or equivalent photo-lithographic emulsion) and a subsequent etch. It is these subsequent processes that, in the current practice, will be associated with wafer warpage and defects in the MTJ film (120). In the processes to be described below, methods for eliminating these defects will be described.

SUMMARY

A first object of the present disclosure is to provide a method for reducing or eliminating defects in thin film depositions on wafers resulting from wafer warpage and process-induced stresses in the deposited MTJ films.

A second object of the present disclosure is to provide increased margins for overlay errors produced by wafer warpage and thin film stresses in the MTJ films, where such errors are accentuated by shrinking technology dimensions and use of larger wafers.

A third object of the present disclosure is to implement the first two objects in as efficient a manner as possible and with a minimum of additional process steps.

The present disclosure achieves these objects by means of the creation of stress-relief trenches within an interconnect and interface layer, or the formation of stress-relief walls on an interconnect and interface layer, on which interconnect and interface layer an MTJ film is subsequently formed, processed and patterned.

In the present disclosure, an interconnect and interface layer provides a mechanism for electrically connecting MTJ thin-film depositions to an underlying CMOS substrate (or equivalent wafer-level substrate). The trenches or walls then create a breakage of the MTJ film into discrete, separated and disconnected segments whereby stress-relief is obtained. This process can be implemented using two basic methods and associated variants that will be fully described below:

First Method. Patterning a connection and interface layer formed on a CMOS substrate with an array of undercut trenches formed before (or after) the MTJ magnetic film deposition. These trenches act as stress-relief mechanisms by segmenting the film.

Second Method. Patterning a connection and interface layer formed on a CMOS substrate with an array of T-shaped walls that act as dividers and then depositing an MTJ film over the interface layer and dividing walls. These dividers act as stress-relief mechanisms by segmenting the film and they can be subsequently removed.

The approach of the first method, above, is implemented by the creation of trenches with undercut profiles. Such trenches break the subsequently deposited metal TMJ films into smaller, isolated segments. FIG. 1 is a schematic illustration of a deposition-covered wafer (5) showing an exemplary horizontal (in the wafer plane) pattern of intersecting vertical (through the plane) trenches (10) that has served to subdivide, into discrete segments (20), a multi-layered deposition that would otherwise have continuously covered the entire wafer surface.

The generation of patterns of trenches having undercut profiles, or the fabrication of similar patterns of T-shaped dividers, both involve the deposition of multi-layer dielectric films, such as films of SiN or $SiO_2$ or low-k dielectric materials, with different etch rates for dry or wet etch methods. The etch rate for the deposited underlayer or underlayers are significantly faster than that for the top layer.

After deposition of dielectric layers, the wafer is photo-patterned, forming hard masks out of photo-resist and then etched. During the etching process, an undercut profile is achieved as a result of the differential between the etch rates of the dielectric underlayer and overlayer, which will be shown below. The height (or depth) and length of the divider (trench) must be sufficient to break the continuity of subsequent MTJ film depositions.

Fabrication processes typically begin by deposition of a so-called "zero-layer" on which alignment marks and overlay boxes are created, before or after an MTJ film deposition. These zero-layer fabrications allow the implementation of accurate photo-process alignments and overlays (OL) on subsequent-layer depositions. It is herein proposed to combine the stress-relief trench-creation layer and the zero-layer into a single layer that performs both functions so no additional mask layer is required to implement the stress-relief process.

In a second method, T-shaped dividers are formed prior to an MTJ film deposition. These dividers can be removed after the MTJ film is deposited by the use of etching or CMP methods.

BRIEF DESCRIPTION OF THE DRAWINGS

FIG. 1 is a schematic illustration showing a circular wafer with an exemplary pattern of trenches in the wafer plane.

FIG. 2 is process flow diagram for an exemplary current process used to pattern MTJ films.

FIGS. 9a-9e schematically illustrate (in wafer cross-sectional views) five steps in a physical implementation of the process steps of the process flow diagram of FIG. 3 (First Method, Variation C) showing the formation of an undercut (trapezoid-shaped) trench.

FIGS. 11a-11e schematically illustrate (in wafer cross-sectional views) five steps in a physical implementation of the process steps of the process flow diagram of FIG. 5 (Third Method) showing the formation of a trench.

DETAILED DESCRIPTION

The present disclosure describes methods by which multi-layered, thin-film devices (e.g. multi-layered thin magnetic film MTJ devices) can be fabricated on a wafer substrate (e.g. a CMOS substrate) so that the multi-layer thin-film deposition is not affected by defects due to stresses in the deposited thin-films caused by wafer warpage and subsequent annealing processes. A first and third method, with several variants, breaks the thin-film deposition, which would otherwise cover the entire wafer, into smaller isolated segments. This is done by forming a pattern of undercut trenches into a connection via and interface layer on which the multi-layer, thin-film deposition is then formed. These trenches, which are of various cross-sectional shapes, then serve as stress-relief mechanisms.

A second method also creates a stress-relief mechanism, but in this method it is done by forming T-shaped dividers that serve as walls along the upper surface of the connection via and interface layer, before the multi-layer thin-film deposition occurs. In either of the methods, for efficiency of the process, the role of the stress-relief layer (whether used for forming trenches or walls) is efficiently combined with the "zero-layer" that normally serves to provide an alignment or overlay mechanism for subsequent photo-lithographic patterning schemes.

First Method, Variation A

Referring now to the new process steps of FIG. 3 and the corresponding illustrations in FIGS. 7a-7n, there will be described and illustrated the process steps of a first method (Variation A) leading to the formation of a pattern of undercut trenches in a via connection and interface layer that will implement a stress-relief mechanism and break an overall MTJ thin-film deposition into discrete, separated pieces that are free of stresses. Note that, for simplicity, the formation of an array of trenches is illustrated using an exemplary single trench, which would be a part of the array. Therefore, the resulting thin-film deposition is shown as being segmented into two portions, while, in practice, it would be segmented into portions bounded by the array of trenches (or walls in the subsequent method).

Figure 3:
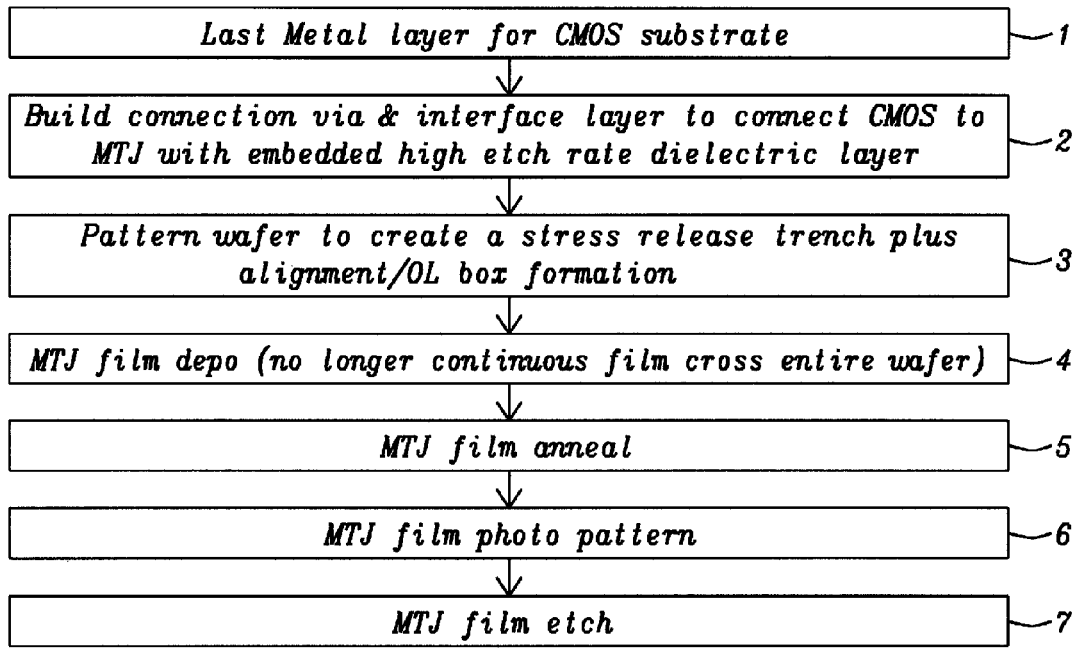
FIG. 3 is a process flow chart for a first trench-forming process (First Method, Variations A, B and C) designed to meet the objects of the present disclosure.
Figure 6A:
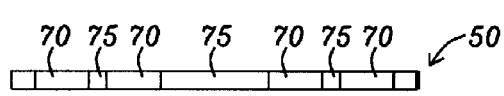
FIGS. 6a, 6b and 6c schematically illustrate (in wafer cross-sectional views) three steps in a physical implementation of the process steps of the current process flow diagram of FIG. 2.
Figure 6B:
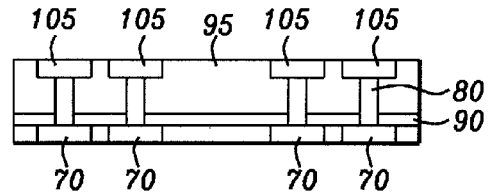
Figure 6C:
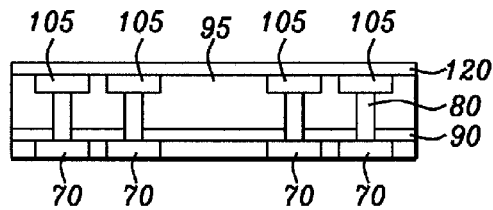
Figure 7A:
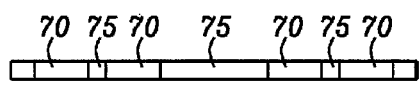
FIGS. 7a-7n schematically illustrate (in wafer cross-sectional views) fourteen steps in a physical implementation of the process steps of the process flow diagram of FIG. 3 (First Method, Variation A) showing the formation of an undercut (inverted-T shaped) trench.

Referring first to block (1) of FIG. 3 and to FIG. 7a, there is shown a "last" CMOS metal layer (50) that is the same as layer (50) of FIG. 6a. This "last," or uppermost layer of the CMOS substrate represents the substrate level on which the process steps begin.

Referring next to the description in block (2) of FIG. 3 and the illustration of FIG. 7b, there is shown a sequence of three dielectric layers that will be used to construct a connection via and interface layer (shown finally completed in FIG. 7i) between the last metal layer (50) and a subsequent MTJ deposition (to be shown below in FIG. 7n).

Layer (200) is an etch-stop layer, layer (210) is an "embedded" high etch rate layer (called "embedded" because it will have an intermediate position within the final structure) and layer (205) is a dielectric layer that will form the insulating and supportive structure of the interface. The thickness of the high etch rate (210) layer can range between approximately 20 nm and 200 nm. The high etch-rate dielectric material of (210) can be SiN, $SiO_2$, or any spin-on dielectric materials or low k materials. It will be used to form the undercut portion of the trench. The designation "high etch rate," is to be understood here and in all of the following in a relative sense. The process described will work properly as long as there is a selectivity of 4 or higher in the etch rates between the embedded layer (210) and an overlayer (e.g. interface dielectric layer (205)). Generally, in all the following, the candidates for the high etch-rate materials can be oxygen plasma or nitrogen plasma etchable materials such as amorphous carbon, porous dielectric materials and other spin-on filler dielectric materials. The top layer, of less high-rate etchable materials, can be formed of SiN, $SiO_2$ or other materials that are normally not etchable by oxygen or nitrogen plasma.

Figure 7B:
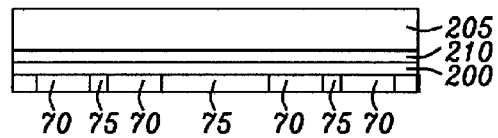
Figure 7C:
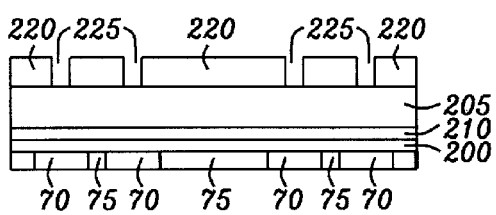

Referring now to process step (3) of FIG. 3 and to FIG. 7c, there is shown the formation and patterning (openings (225)) of a photo-resist layer (220) formed on layer (205) of the previous fabrication of FIG. 7b. This photo-resist layer will form a hard mask to allow the formation of vias by means of an etching process through the patterned openings.

Figure 7D:
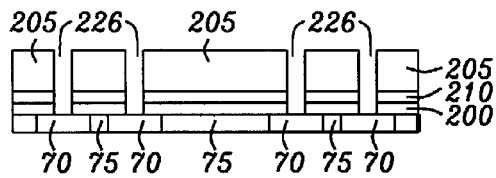

Referring now to FIG. 7d, there is shown the result of applying an etching process through the patterned openings (225) of FIG. 7c to form corresponding openings (226) for conducting vias. The etch process can be a dry etch, a wet etch or a combination of the two that allows penetration to the connection layers (70).

Figure 7E:
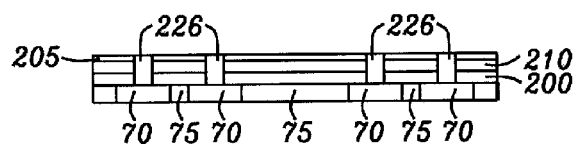

Referring now to FIG. 7e, there is shown the formation of vias (227) by filling the etched openings with a conducting material, such as a metal. The vias electrically contact the segmented connection layers (70) in the last CMOS layer. The dielectric interface layer (205) is then smoothed and thinned, along with the vias, using a CMP process.

Figure 7F:
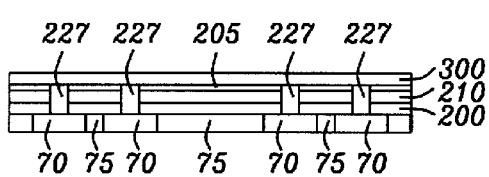

While still within the descriptive portion of FIG. 3 block (2) and referring to FIG. 7f, there is shown the fabrication of FIG. 7e with the addition of a deposition of an additional metal interface layer (300).

Figure 7G:
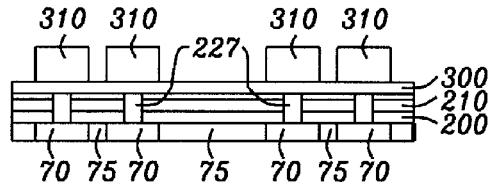

Referring next to FIG. 7g there is shown a second patterned photo-lithographic film (310) (e.g. photoresist) formed over the metal interface layer (300). This film will act as a hard-etch mask.

Figure 7H:
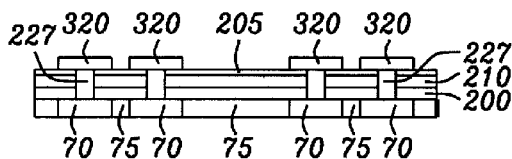

Referring next to FIG. 7h, there is shown the results of an etching process on the metal interface layer ((300) of FIG. 7g), leaving behind conducting pads (320) electrically contacting the vias (227).

Figure 7I:
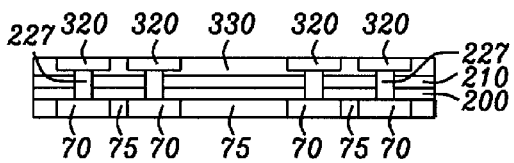

Referring now to FIG. 7i, there is shown the fabrication of FIG. 7h with the addition of a blanket dielectric deposition (330), which is planarized and rendered co-planar with the surfaces of the conducting pads (320). The additional blanket layer is materially identical to dielectric overlayer ((205) in FIG. 7b) and the two layers together combine to form the interface layer (330) of the fabrication. This fabrication is now the completed connection via and interface layer described as to be built in process box (2) of FIG. 3. We will now use this layer fabrication (or its equivalent in FIG. 8b, FIG. 9b, FIG. 10b and FIG. 11b) as a starting point for forming the stress-relief mechanism of trench or wall. This fabrication would also serve as the zero-layer for subsequent masking and overlay processes as required for the MTJ layers.

Figure 7J:
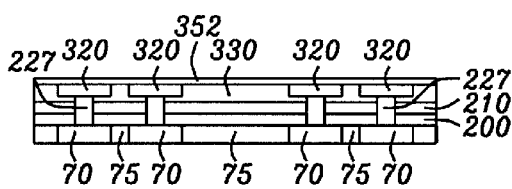

Referring now to FIG. 7j, there is shown the deposition of an optional protective layer (352) over the fabrication of FIG. 7i.

Figure 7K:
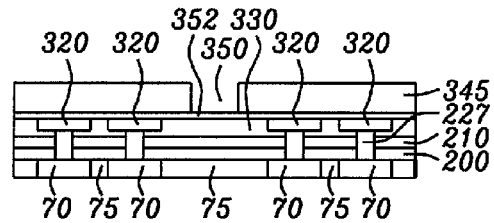

Referring now to process box (3) of FIG. 3 and FIG. 7k, there is shown the first process step in the formation of a stress-relief trench in the connection via and interface layer fabrication of FIG. 7i. In this step, a third photo-lithographic (photo-resist) layer (345) is deposited to form a hard-mask and then etched to form an opening (350) through which a trench will be formed. The opening will have an approximate width of 20 nm.

Figure 7L:
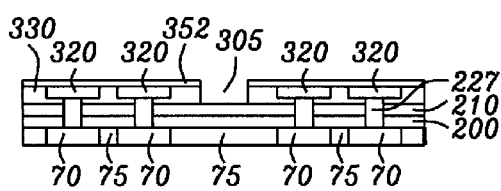

Referring to FIG. 7l, there is shown the results of a third etch process through hard-mask opening (350) of FIG. 7k, now forming a corresponding opening (305) of uniform width in the dielectric layer (330) reaching to the depth of the high etch rate layer (210). The hard mask layer (345) is then removed.

Figure 7M:
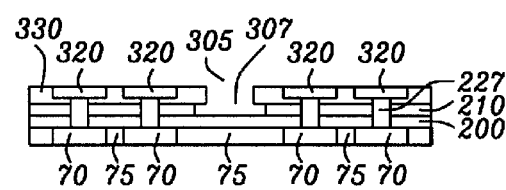

Referring to FIG. 7m, there is shown the results of an additional fourth etch (or the continuation of the third etch), which significantly widens an undercut opening (307) in the high etch rate layer (210) compared to the width of the opening (305) which remains substantially the same in its width because of its slower etch rate. As was already noted above, the thickness of the high etch rate (210) layer can range between approximately 20 nm and 200 nm. Preferably the width of the undercut portion (307) etched in this layer should be greater than approximately 20 nm (the width of the opening in the dielectric overlayer) to effectively break the continuous deposited MTJ layer into separated segments as will be shown below in FIG. 7n. It can be seen that the shape of the trench, in vertical cross-section, is an inverted T, formed from the openings (305) and (307). It is understood that opening (305) and (307) extends linearly along the upper surface of the CMOS layer as in FIG. 1, perpendicular to the plane of the preceding figures and that the illustration shown in these figures are vertical cross-sections of the opening.

Figure 7N:
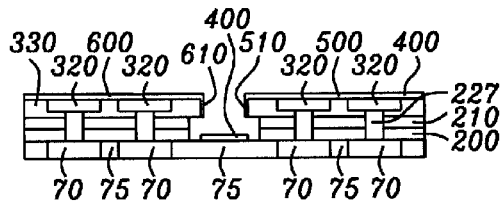

Referring now to process step (4) of FIG. 3 and illustration FIG. 7n, there is shown the formation of what would be a continuous MTJ film, (400), over the fabrication of FIG. 7m. The trench, (305) and (307), however, has effectively separated the MTJ film into two isolated portions (500) and (600), which can now be subjected to the further processing steps (e.g. patterning and annealing) described in FIG. 3 (5)-(7), while being resistant to the effects of stresses induced by those steps because of the stress-relief furnished by the free ends (510) and (610) of the isolated portions where they intersect the trench walls.

First Method, Variation B

Referring again to the process steps of FIG. 3, while now observing corresponding illustrations in FIGS. 8a-8g, there will be described and illustrated the process steps of a First Method, Variation B leading to the formation of a pattern of undercut trenches that will also implement a stress-relief mechanism and break the overall MTJ multi-layer deposition into discrete, separated pieces that are free of stresses. These undercut trenches, however, have a trapezoidal vertical cross-sectional shape that is unlike the inverted T of Variation A and are formed using a somewhat different sequence of process steps that will now be described.

Figure 8A:
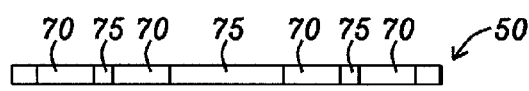
FIGS. 8a-8g schematically illustrate (in wafer cross-sectional views) seven steps in a physical implementation of the process steps of the process flow diagram of FIG. 3 (First Method, Variation B) showing the formation of an undercut (trapezoid-shaped) trench.

Referring first to process step (1) of FIG. 3 and to corresponding FIG. 8a, there is shown a last CMOS metal layer (50) that is the same as layer (50) of FIG. 6a and FIG. 7a. It represents the starting point of the process.

Figure 8B:
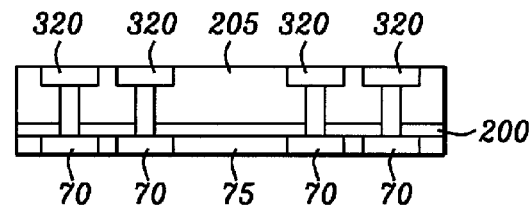

Referring next to the process description in block (2) of FIG. 3 and the illustration of FIG. 8b, there is shown a connection via and interface layer that has been fabricated almost precisely according the sequence of illustrated steps already shown previously in FIGS. 7b-7i, however those steps are not shown now because of their repetitious nature.

The fabrication in FIG. 8b is a connection via and interface layer that is virtually identical to that shown previously in FIG. 7i, except that the two layers (205) and (210) of FIG. 7b, with different etch rate characteristics (high and low etch rates) have now been replaced by a single layer (205) with a single etch rate characteristic. Etch-stop layer (200) remains. All process steps shown in FIGS. 7b-7h have been repeated to form FIG. 8b, except separate layer (210) was never deposited and is not needed in the subsequent steps. This fabrication of FIG. 8b is now the analog of the connection via and interface layer in FIG. 7i, which is described as to be built in process box (2) of FIG. 3 in order to connect a CMOS substrate to an MTJ film.

Figure 8C:
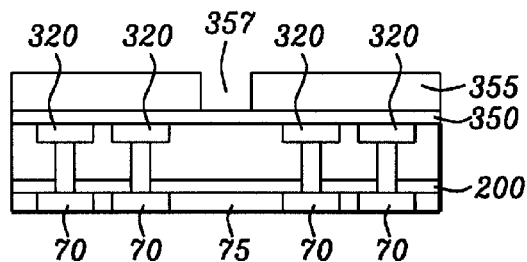

Referring now to FIG. 8c, there is shown the deposition of a protective layer (350) over the fabrication of FIG. 8b. The protective dielectric layer will be formed of a dielectric material with a lower etch rate than that of the interface dielectric layer (205) which has a high etch rate (approximately 4 times the etch rate of the protection layer). A photo-resistive layer (355) is formed over layer (350) and patterned to open a region (357) of approximately 20 nm width through which a stress-relief trench will be formed.

Figure 8D:
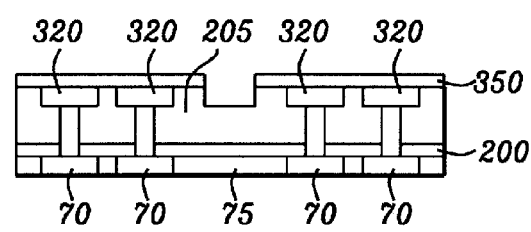

Referring now to FIG. 8d, there is shown the first process step in the formation of a stress-relief trench in the fabrication of FIG. 8c. In this step a dry etch process creates an opening through protective layer (350) using layer (355) of the previous FIG. 8c as a hard mask. The dry etch is shown as having continued to remove a portion of layer (205).

Figure 8E:
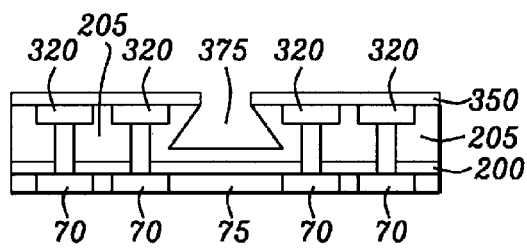

Referring now to FIG. 8e, there is shown the continuation of the dry etch process, or the switch to a wet etch process, to etch further into layer (205). The presence of the protective layer (350) now causes the dry (or wet) etch to create a trench with an undercut profile (375) because the dielectric layer (205) etches more rapidly than the protective layer (350) above it. The trench cross-section is shown as trapezoidal, but it is understood that this shape is exemplary of an undercut region that expands laterally with depth vertically.

Figure 8F:
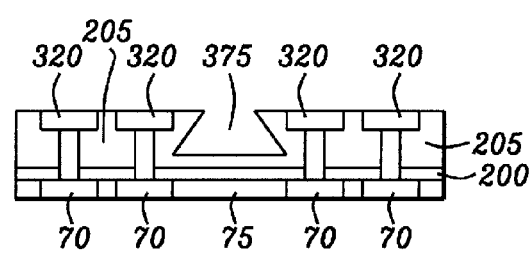

Referring now to FIG. 8f, there is shown the results of applying a second etch process to remove the protective layer ((355) of FIG. 8e).

Figure 8G:
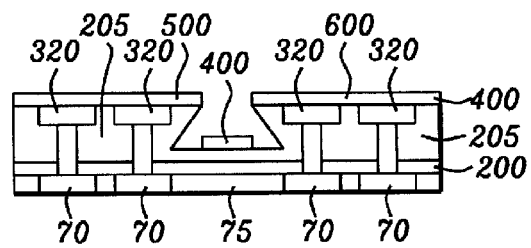

Finally, FIG. 8g shows the fabrication of FIG. 8f, with the formation of an MTJ film, (400), over the fabrication of FIG. 8f. The trench, (375) has effectively separated the MTJ film into two isolated portions (500) and (600), which can now be subjected to the further processing steps described in FIG. 3, blocks (5)-(7), while being resistant to the effects of stresses induced by those steps because of the stress-relief furnished by the free ends (510) and (610) of the isolated portions where they intersect the trench walls.

First Method, Variation C

Referring again to the process steps of FIG. 3, while now observing corresponding illustrations in FIGS. 9a-9e, there will be described and illustrated the process steps of a First Method, Variation C leading to the formation of a pattern of undercut trenches that will also implement a stress-relief mechanism and break the overall MTJ multi-layer deposition into discrete, separated pieces that are free of stresses. These undercut trenches have a trapezoidal vertical cross-section that is like that of Variation B above, and unlike the inverted T form of Variation A. They are formed using a somewhat different sequence of process steps than those of Variation B, that will now be described.

Referring first to process step (1) of FIG. 3 and to corresponding FIG. 9a, there is shown a last CMOS metal layer that is the same as layer (50) of FIG. 6a, FIG. 7a and FIG. 8a. It represents the starting point of the process.

Referring next to the process description in block (2) of FIG. 3 and the illustration of FIG. 9b, there is shown a connection via and interface layer, like that of FIG. 8b, that has been fabricated according to the same sequence of illustrated steps leading to the formation of FIG. 8b as previously discussed.

Referring now to FIG. 9c, there is shown a fabrication analogous to that shown in FIG. 8c except that the protective layer (350) over the fabrication of FIG. 8c is absent. Instead, FIG. 9c shows a photoresistive layer (355) that is formed directly over the upper surface of the fabrication of FIG. 9b and is patterned to open a region (357) of approximately 20 nm width through which a stress-relief trench will be formed.

Referring now to FIG. 9d, there is shown the first process step in the formation of a stress-relief trench in the fabrication of FIG. 9c. In this step a dry or wet etch process creates a trench (in a direction perpendicular to the plane of this figure) with an expanding cross-section through the patterned photomask region (357) using photoresist layer (355) of the previous figure as a hard mask. The etched region descends vertically and is stopped by etch-stop layer (200). The trench cross-section is shown as trapezoidal, but it is understood that this shape is exemplary of an undercut region that expands laterally with depth vertically. The layer of photoresist is then removed using an etchant.

Finally, FIG. 9e shows the fabrication of FIG. 9d, with the formation of an MTJ film, (400), over the fabrication of FIG. 9d. The trench, (375) has effectively separated the MTJ film into two isolated portions (500) and (600) (a small portion also shown at the bottom of the trench), which can now be subjected to the further processing steps described in FIG. 3 (5)-(7), while being resistant to the effects of stresses induced by those steps because of the stress-relief furnished by the free ends (510) and (610) of the isolated portions where they intersect the trench walls.

Second Method

Referring now to the process flow steps of FIG. 4, while observing corresponding illustrations in FIGS. 10a-10i, there will be described and illustrated the process steps of a Second Method, leading to the formation of a pattern of walls, rather than trenches, that will also implement a stress-relief mechanism and break the overall MTJ multi-layer deposition into discrete, separated pieces that are free of stresses.

Figure 4:
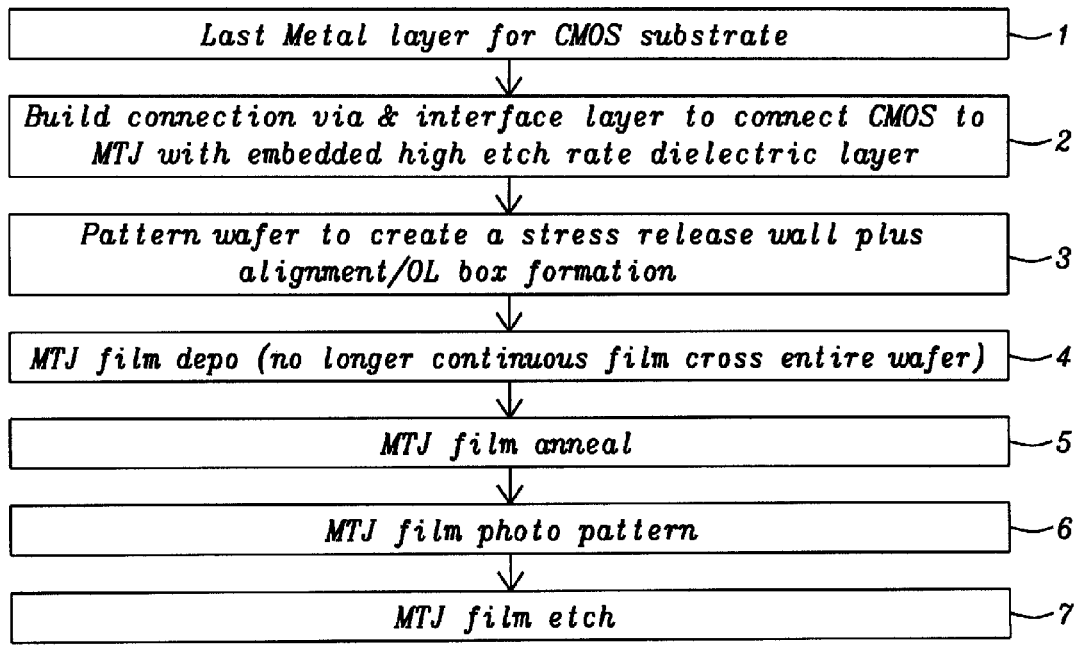
FIG. 4 is a process flow chart for a wall-forming process (Second Method) designed to meet the objects of the present disclosure.
Figure 10A:
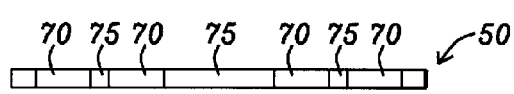
FIGS. 10a-10i schematically illustrate (in wafer cross-sectional views) nine steps in a physical implementation of the process steps of the process flow diagram of FIG. 4 (Second Method) showing the formation of a T-shaped wall and subsequent processing of an MTJ deposition.

Referring first to process step (1) of FIG. 4 and to corresponding FIG. 10a, there is shown a last CMOS metal layer that is the same as layer (50) of FIG. 6a, FIG. 7a, FIG. 8a, and FIG. 9a. It represents the starting point of the process.

Figure 10B:
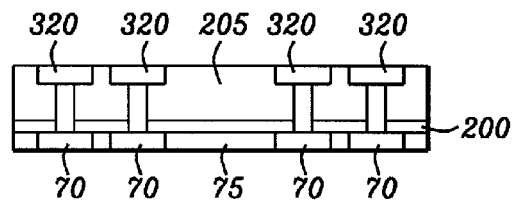

Referring next to the process description in process block (2) of FIG. 4 and the illustration of FIG. 10b, there is shown a connection via and interface layer identical to that in FIG. 8b that has been fabricated according the sequence of illustrated steps already shown previously in FIGS. 7b-7i, however those steps leading to the fabrication are not shown now because of their substantially repetitious nature.

The fabrication in FIG. 10b is virtually identical to that shown previously in FIG. 7i, except that the two layers (205) and (210) of FIG. 7b, with different etch rate characteristics are not required in this process sequence, so they have now been replaced by a single layer (205) with a single etch rate characteristic. All process steps shown in FIGS. 7b-7i have been replicated to form the fabrication of FIG. 10b, except separate layer (210) was never deposited. This fabrication of FIG. 10b is now the analog of the connection via and interface layer in FIGS. 7i and 8b, which is described as to be built in process box (2) of FIG. 4 in order to connect a CMOS substrate to an MTJ film.

Figure 10C:
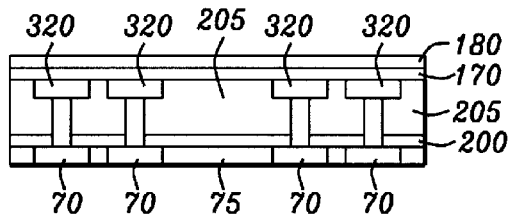

Referring now to process step (3) of FIG. 4 and to a corresponding schematic illustration in FIG. 10c, there is shown the first step in building a wall on the upper surface of the fabrication of FIG. 10b. To this end, two material layers, (170) and (180), with different etch rates are deposited on the top of the fabrication. The low etch-rate layer (180) is deposited over the high etch-rate layer (170). As in the previous discussion, "high" and "low" as referring to etch rates are relative terms referring to an etch-rate selectivity of a factor of 4 between the two layers.

Figure 10D:
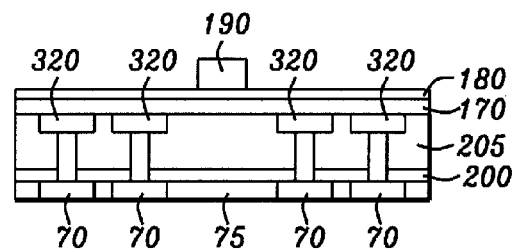

Referring next to FIG. 10d, there is shown a patterned photo-resist (190) formed on the uppermost layer (180) of the two dielectric layers. This film will serve as an etch mask.

Figure 10E:
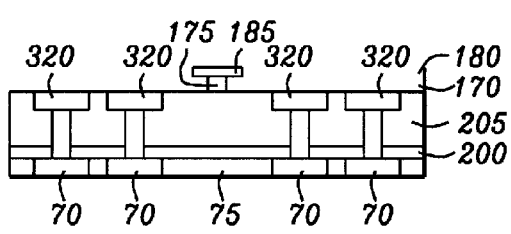

Referring next to FIG. 10e, there is shown the results of an etching process performed on the masked fabrication of FIG. 10d. The upper dielectric layer ((180) in FIG. 10d) has been etched away laterally beyond the width of the remaining patterned film ((190) in FIG. 10d) leaving a horizontal base (185). The dielectric layer ((170) in FIG. 10d) has been etched away even further, because of its higher etch rate, leaving a narrow pedestal (175) supporting the wider base (185). The structure of the base and pedestal has an approximately T-shaped cross-section. It is further understood that the T-shaped structure extends across the entire CMOS substrate (see FIG. 1) linearly in a direction perpendicular to the cross-sectional plane, so that the base (185) and pedestal (175) have the aspect of a wall that will create the separation of the deposited MTJ layer.

Etchants for the higher etch-rate layer ((170) in FIG. 10d) can be oxygen or $N_2$ plasmas and the corresponding material for that layer can be any material that etches rapidly under these etchants, such as amorphous carbon, porous dielectric material and other spin-on filler materials. These materials must also have a high etch-rate selectivity as compared to the dielectric materials (205) used in forming the connection and interface layer, and the upper layer dielectric material (180). The upper layer (180) can be a layer of SiN, $SiO_2$ or any other material that does not etch using an oxygen plasma.

Figure 10F:
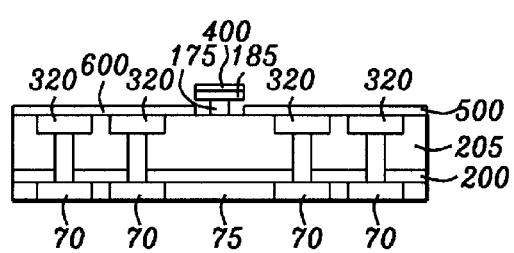

Referring next to FIG. 10f, there is shown the results of an MTJ film deposition (400). Although the film has been deposited continuously over the entire fabrication, the vertical extension of the base/pedestal combination (185)/(175) causes the film to separate into two disjoint portions (500) and (600) (a small portion remaining on top of (185)). These two disjoint portions will not be susceptible to stress related defects resulting from subsequent processing steps, such as those to be now shown, and will therefore meet the objects of this disclosure.

Figure 10G:
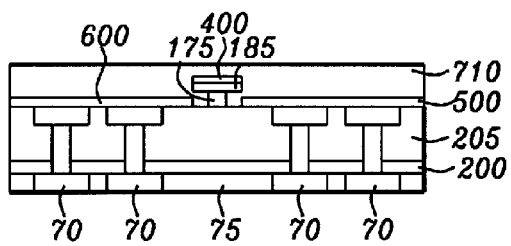

Referring next to FIG. 10g, there is shown the first of a sequence of steps for further processing of the deposited MTJ film portions (500) and (600). First a BARC (bottom anti-reflective coating) or dielectric layer (710) is spun on over the fabrication of FIG. 10f. This layer is then planarized. It is noted that the connection via and interface layer is effectively serving as a zero-layer in that it provides a substrate for masking operations used to define structures of the MTJ layer.

Figure 10H:
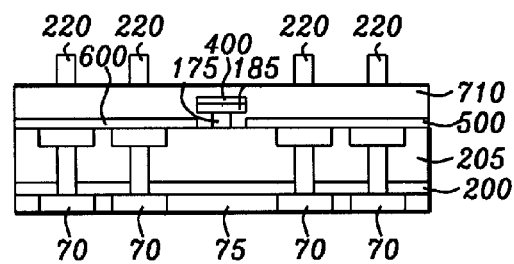

Referring next to FIG. 10h, there is shown a patterned photo-resist layer (220) (a mask) formed over the BARC or dielectric layer (7.10).

Figure 10I:
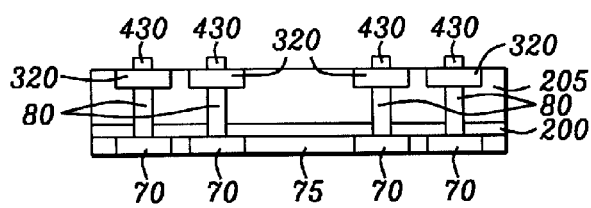

Referring next to FIG. 10i, there is shown the two MTJ portions ((500) and (600)) of FIG. 10g) patterned into separated segments (430), each segment now electrically contacting a connection pad (320), a via (80) and, ultimately, CMOS segment (70). It is to be noted that although this method has utilized an initial layering of two dielectric layers (170) and (180) of unequal etch rates to create the T-shaped base/pedestal structure (175)/(185) that breaks the MTJ deposition, it is also possible to create a T-shaped structure using a single layer deposited film.

Third Method

Finally, there is now described a third method for separating a deposited MTJ film using a simpler trench formation method. Referring again to the process steps in the flow chart of FIG. 5, while observing corresponding illustrations in FIGS. 11a-11e, there will be described and illustrated the process steps of this method.

Figure 5:
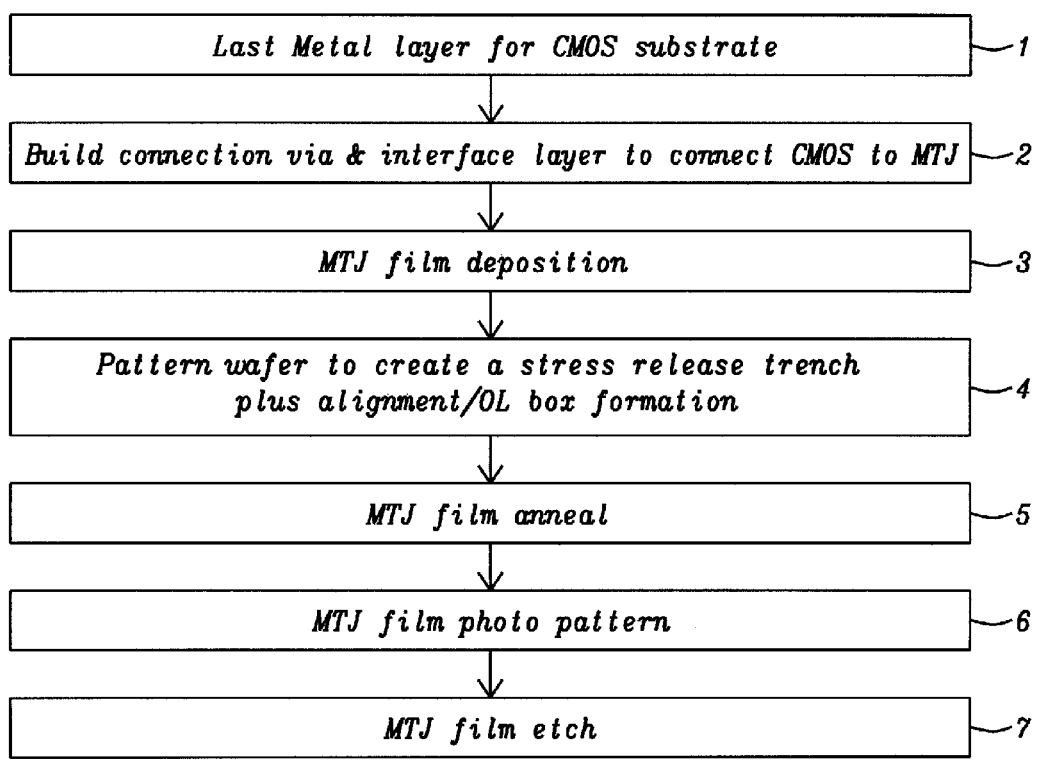
FIG. 5 is a process flow chart for yet an additional alternative trench-forming process (Third Method) designed to meet the objects of the present disclosure.

Referring first to process step (1) of FIG. 5 and to corresponding FIG. 11a, there is shown a last CMOS metal layer that is the same as layer (50) of FIG. 6a, FIG. 7a, FIG. 8a, and FIG. 9a. It represents the starting point of the process.

Referring next to the process description in process block (2) of FIG. 5 and the illustration of FIG. 11b, there is shown a connection via and interface layer that is identical to that in FIG. 8b. There is shown the conducting pads (320), the inter-layer dielectric (205) and the etch-stop layer (200).

Referring now to process block (3) of FIG. 5 and to FIG. 11c, there is shown the connection via and interface layer that is the completed fabrication of FIG. 11b, onto whose upper surface an MTJ film (400) has been continuously deposited.

Referring next to process block (4) of FIG. 5 and to FIG. 11d, there is shown a photo-resist film (700) that has been formed directly on the MTJ film (400) and patterned to form an opening (750). This will be used as a hard mask. The opening (750) has been formed in the photo-resist film with sufficient width (approximately 20 nm) to allow etching of a corresponding opening through the MTJ film (400) to form a stress-relief trench.

Referring finally to FIG. 11e, there is shown the result of a dry or wet etch that has formed the corresponding opening through the MTJ film and continued to form a trench (215) in the interface dielectric layer (205) of the connection via and interface layer. The two segments (500) and (600) of the separated MTJ film can now be further processed while remaining in a stress-free state.

As is finally understood by a person skilled in the art, the preferred embodiments of the present disclosure are illustrative of the present disclosure rather than limiting of the present disclosure. Revisions and modifications may be made to methods, materials, structures and dimensions employed in forming and providing a stress-relief mechanism for an MTJ deposition by a pattern of walls or trenches and the resulting stress-free MTJ deposition so patterned, while still providing such a process and fabrication in accord with the spirit and scope of the present disclosure as defined by the appended claims.

What is claimed is:

1. A thin-film deposition comprising:
   a substrate:
   a pattern of walls formed on the substrate;
   a multi-layered thin-film deposition formed on said substrate, wherein said thin-film deposition is broken into segments by said pattern of walls and wherein said thin-film deposition is subsequently processed; whereby process-induced stresses are relieved by said pattern of walls; and
   said thin-film deposition is free of defects normally caused by said process-induced stresses.

2. The thin-film deposition of claim 1 wherein said substrate is a CMOS substrate and wherein said multi-layered thin-film deposition is an MTJ deposition.

3. The thin-film deposition of claim 2 wherein said CMOS substrate has a last metal layer and a connection via and interface layer formed on said last metal layer and wherein said pattern of walls is formed on said via and interface layer.

4. The thin-film deposition of claim 1 wherein said walls are T-shaped in vertical cross-section, having a wide base supported by a narrow pedestal.

5. The thin-film deposition of claim 3 wherein said walls have a wide base portion formed of a first dielectric material having a low etch rate and wherein said wide base portion is supported on a narrow pedestal portion formed of a second dielectric material having a high etch rate.

6. The thin-film deposition of claim 5 wherein said second dielectric material is the high etch rate material amorphous carbon, porous dielectric material or other spin-on filler materials that etch rapidly under $N_2$ or oxygen plasmas and wherein said first dielectric material is SiN, $SiO_2$ or any other material that does not etch using an oxygen or $N_2$ plasma.

* * * * *